United States Patent
Kim et al.

(10) Patent No.: US 11,735,652 B2
(45) Date of Patent: Aug. 22, 2023

(54) FIELD EFFECT TRANSISTORS HAVING FERROELECTRIC OR ANTIFERROELECTRIC GATE DIELECTRIC STRUCTURE

(71) Applicant: Intel Corporation, Santa Clara, CA (US)

(72) Inventors: Seiyon Kim, Portland, OR (US); Uygar E. Avci, Portland, OR (US); Joshua M. Howard, Portland, OR (US); Ian A. Young, Portland, OR (US); Daniel H. Morris, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 140 days.

(21) Appl. No.: 16/635,739

(22) PCT Filed: Sep. 28, 2017

(86) PCT No.: PCT/US2017/054164
§ 371 (c)(1),
(2) Date: Jan. 31, 2020

(87) PCT Pub. No.: WO2019/066875
PCT Pub. Date: Apr. 4, 2019

(65) Prior Publication Data
US 2020/0321446 A1 Oct. 8, 2020

(51) Int. Cl.
*H01L 29/66* (2006.01)
*H01L 29/51* (2006.01)

(52) U.S. Cl.
CPC ........ *H01L 29/6684* (2013.01); *H01L 29/516* (2013.01)

(58) Field of Classification Search
CPC .... H01L 29/6684; H01L 29/516; H01L 29/78
See application file for complete search history.

(56) References Cited

U.S. PATENT DOCUMENTS

2004/0141357 A1* 7/2004 Dimmler .......... H01L 27/11502
365/145
2008/0076214 A1 3/2008 Han et al.
(Continued)

FOREIGN PATENT DOCUMENTS

JP 2005-505920 2/2005
WO WO-03030243 4/2003

OTHER PUBLICATIONS

Migita et al. "Polarization switching behavior of Hf—Zr—O ferroelectric ultrathin films studied through coercive field characteristics," Japanese Journal of Applied Physics 57, 04FB01, 2018 (Year: 2018).*

(Continued)

*Primary Examiner* — Julia Slutsker
(74) *Attorney, Agent, or Firm* — Schwabe, Williamson & Wyatt, P.C.

(57) ABSTRACT

Field effect transistors having a ferroelectric or antiferroelectric gate dielectric structure are described. In an example, an integrated circuit structure includes a semiconductor channel structure includes a monocrystalline material. A gate dielectric is over the semiconductor channel structure. The gate dielectric includes a ferroelectric or antiferroelectric polycrystalline material layer. A gate electrode has a conductive layer on the ferroelectric or antiferroelectric polycrystalline material layer, the conductive layer including a metal. A first source or drain structure is at a first side of the gate electrode. A second source or drain structure is at a second side of the gate electrode opposite the first side.

19 Claims, 9 Drawing Sheets

(56) References Cited

U.S. PATENT DOCUMENTS

| | | | |
|---|---|---|---|
| 2012/0070955 A1 | 3/2012 | Basceri et al. | |
| 2016/0247932 A1* | 8/2016 | Sakai | H01L 29/40111 |
| 2017/0141235 A1* | 5/2017 | Lai | H01L 29/78391 |
| 2017/0358684 A1* | 12/2017 | Chen | H01L 29/40111 |

OTHER PUBLICATIONS

Muller et al., ."Ferroelectricity in Simple Binary ZrO2 and HfO2," Nano Lett., 12, pp. 4318-4323, 2012 (Year: 2012).*

International Search Report and Written Opinion for International Patent Application No. PCT/US2017/054164 dated May 29, 2018, 13 pgs.

J. Robertson: "High dielectric constant oxides", The European Physical Journal Applied Physics, vol. 28, No. 3, Dec. 1, 2004 (Dec. 1, 2004), pp. 265-291, XP055054404, ISSN: 1286-0042.

Anna Chernikova et al.: "Ultrathin Hf 0.5 Zr 0.5 0 2 Ferroelectric Films on Si", ACS Applied Materials & Interfaces, vol. 8, No. 11, Mar. 14, 2016 (Mar. 14, 2016), pp. 7232-7237, XP055459026, US ISSN: 1944-8244.

Search Report from European Patent Application No. 17927533.4, dated Mar. 16, 2021, 7 pgs.

International Search Report and Written Opinion for International Patent Application No. PCT/US2017/054164 dated Apr. 9, 2020, 10 pgs.

Office Action for European Patent Application No. 17927533.4, dated Jul. 5, 2022, 6 pgs.

"Snow ES et al.: ""A Metal/Oxide Tunnelling Transistor"", Semiconductor Science Technology, IOP Publishing Ltd, GB, vol. 13, No. SA, Aug. 1, 1998 (Aug. 1, 1998), pp. A75-A78, XP000768868, ISSN: 0268-1242, DOI: 10.1088/0268-1242/13/SA/023".

* cited by examiner

PLAN VIEW 600

CROSS-SECTIONAL VIEWS

FIELD EFFECT TRANSISTORS HAVING FERROELECTRIC OR ANTIFERROELECTRIC GATE DIELECTRIC STRUCTURE

CROSS-REFERENCE TO RELATED APPLICATION

This patent application is a U.S. National Phase Application under 35 U.S.C. § 371 of International Application No. PCT/US2017/054164, filed Sep. 28, 2017, entitled "FIELD EFFECT TRANSISTORS HAVING FERROELECTRIC OR ANTIFERROELECTRIC GATE DIELECTRIC STRUCTURE," which designates the United States of America, the entire disclosure of which is hereby incorporated by reference in its entirety and for all purposes.

TECHNICAL FIELD

Embodiments of the disclosure are in the field of integrated circuit structures and, in particular, field effect transistors having a ferroelectric or antiferroelectric gate dielectric structure.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips.

For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant. In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and compatibility with the existing high-yielding bulk silicon substrate infrastructure. Scaling multi-gate transistors has not been without consequence, however. As the dimensions of these fundamental building blocks of microelectronic circuitry are reduced and as the sheer number of fundamental building blocks fabricated in a given region is increased, the constraints on the semiconductor processes used to fabricate these building blocks have become overwhelming.

Variability in conventional and state-of-the-art fabrication processes may limit the possibility to further extend them into the, e.g. 10 nm or sub-10 nm range. Consequently, fabrication of the functional components needed for future technology nodes may require the introduction of new methodologies or the integration of new technologies in current fabrication processes or in place of current fabrication processes.

DESCRIPTION OF THE EMBODIMENTS

Figure 1A:
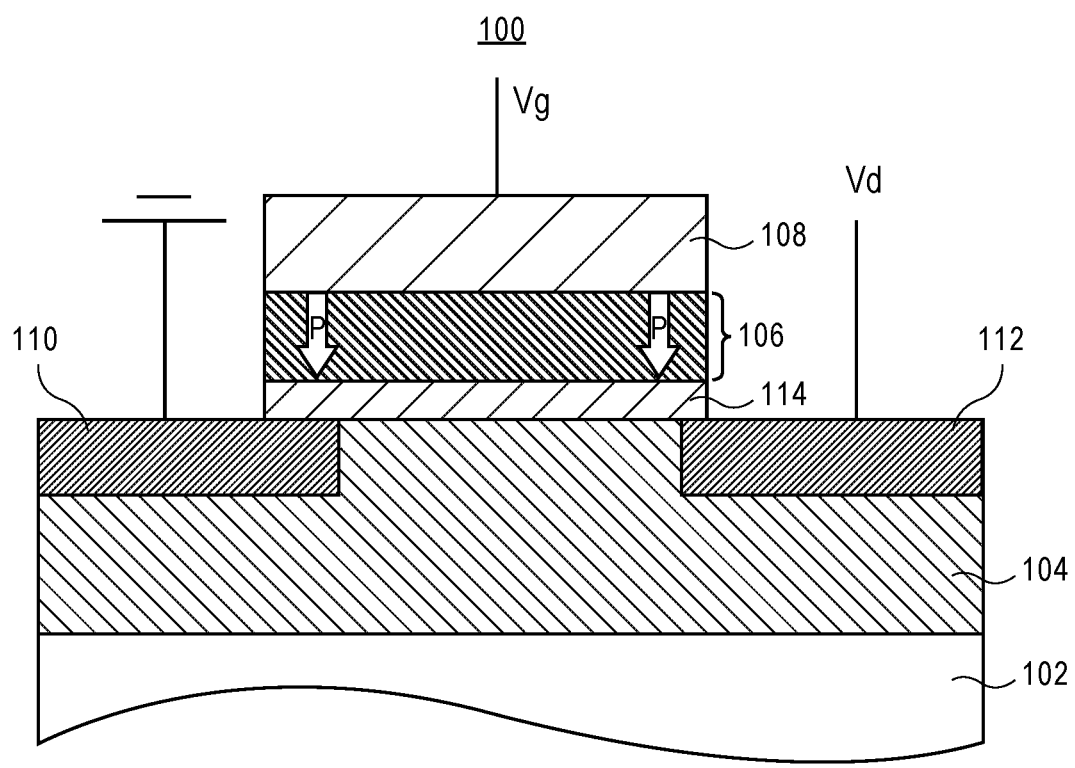
FIGS. 1A and 1B illustrate cross-sectional views of two different states of a ferroelectric field effect transistor (FeFET), in accordance with an embodiment of the present disclosure.

Field effect transistors having a ferroelectric or antiferroelectric gate dielectric structure are described. In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments described herein are directed to high charge negative capacitance field effect transistors (FET) including ferroelectric and anti-ferroelectric gate dielectric structures. Embodiments may be directed to or include anti-ferroelectric dielectrics, ferroelectric dielectrics, high-charge gates, steep slope (SS) devices. Embodiments may be directed to logic technology applications requiring a high performance and/or steep sub-threshold slope transistor.

In an embodiment, approaches are described herein to increase charge in a device channel and improve sub-threshold behavior by adopting ferroelectric or anti-ferroelectric gate oxides. Ferroelectric and anti-ferroelectric gate oxide can increase channel charge for higher current and also can make steeper turn-on behavior. To provide context, conventional high-k gate oxides do not exhibit such behavior.

To provide context, hafnium/zirconium (Hf/Zr) based ferroelectric and antiferroelectric (FE/AFE) materials are typically much thinner than conventional ferroelectric material such PZT and, as such, may be compatible with highly scaled logic technology. There are two features of FE/AFE materials can improve the performance of logic transistors: (1) the higher charge in the channel achieved by FE/AFE polarization and (2) a steeper turn-on behavior due to a sharp FE/AFE transition. Such properties can improve the transistor performance by increasing current and reducing sub-threshold swing (SS).

Embodiments may include the implementation of FE or AFE gate dielectric structures or portions and a variety of architectures. In one embodiment, the gate dielectric material of a conventional architecture is changed. In one embodiment, FE/AFE material is included under a tip spacer only (e.g., to control fringe field). In one embodiment, a FE/AFE is implemented under a gate only (e.g., to impact the channel only). Embodiments may be implemented to provide higher performance and lower leakage transistors. Experimental demonstration of an FE/AFE transistor reveals performance improved over baseline logic transistors. It is to be appreciated that, in some embodiments, FE devices have very sharp turn-on behavior.

Figure 1B:
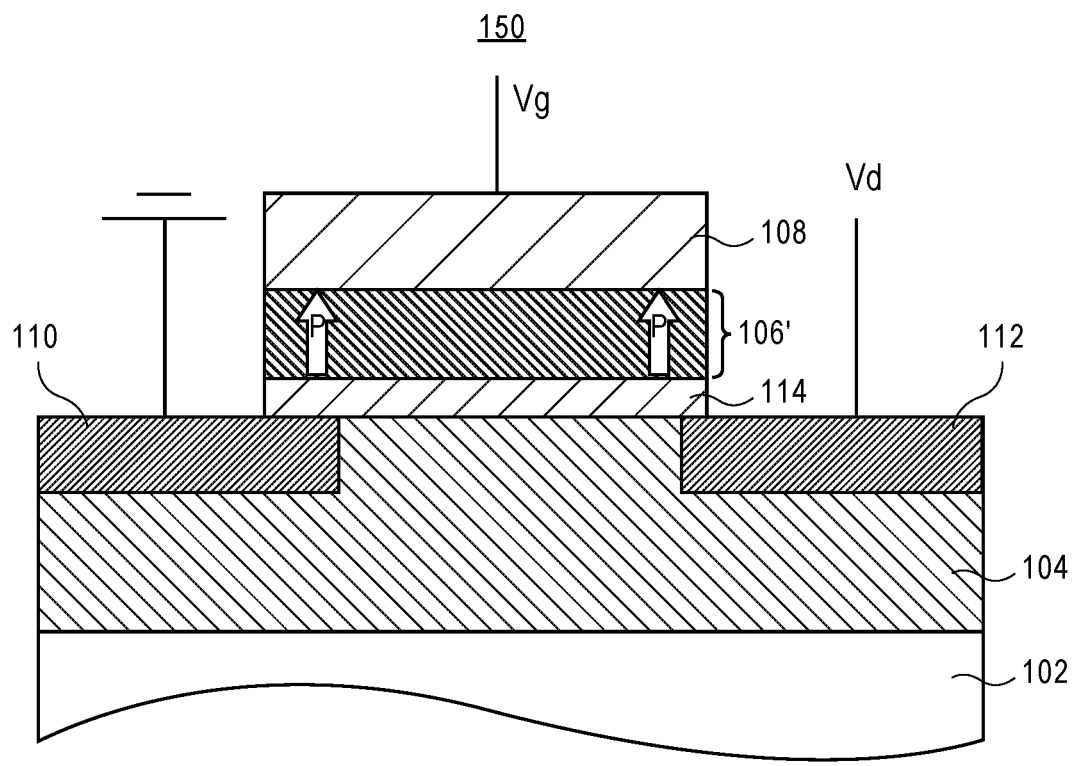

As a first exemplary ferroelectric field effect transistor structure, FIGS. 1A and 1B illustrate cross-sectional views of two different states of a ferroelectric field effect transistor (FeFET), in accordance with an embodiment of the present disclosure.

Referring to FIG. 1A, an integrated circuit structure 100 includes a semiconductor channel layer 104 above a substrate 102. In one embodiment, the semiconductor channel layer 104 is composed of a Group III-V material. A ferroelectric oxide material 106 is above the semiconductor channel layer 104 and, in some embodiments, may include an intervening dielectric layer 114, as depicted. A gate electrode 108 is on the ferroelectric oxide material 106. The gate electrode 108 has a first side and a second side opposite the first side. A first source/drain region 110 is at the first side of the gate electrode 108, and a second source/drain region 112 is at the second side of the gate electrode 108. In the state shown for FIG. 1A, when gate voltage is high, the polarization of FE/AFE material is set up and it will increase the effective capacitance of gate to increase the channel charge, so it will improve the on current. Since this turning-on behavior is abrupt, steep subthreshold operation is also possible.

Referring to FIG. 1B, the integrated circuit structure of FIG. 1A is shown as integrated circuit structure 150, where Id is low, and a state "0" is read. To program the cell 100/150, a positive or negative gate voltage (Vg) is applied to switch polarization (P) of the ferroelectric layer downward (layer 106 of FIG. 1A) or upward (layer 106' of FIG. 1B), respectively, as is depicted in FIGS. 1A and 1B.

Figure 2A:
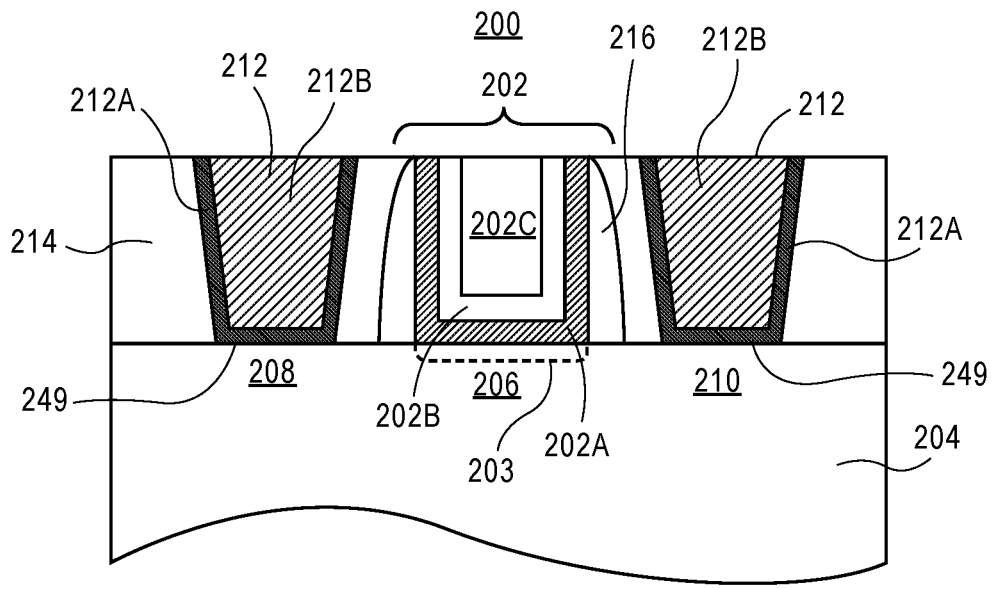
FIG. 2A illustrates a cross-sectional view of a semiconductor device having a ferroelectric or antiferroelectric gate dielectric structure, in accordance with an embodiment of the present disclosure.

FIG. 2A illustrates a cross-sectional view of a semiconductor device having a ferroelectric or antiferroelectric gate dielectric structure, in accordance with an embodiment of the present disclosure.

Referring to FIG. 2A, an integrated circuit structure 200 includes a gate structure 202 above a substrate 204. In one embodiment, the gate structure 202 is above or over a semiconductor channel structure 206 including a monocrystalline material, such as monocrystalline silicon. The gate structure 202 includes a gate dielectric over the semiconductor channel structure 206 and a gate electrode over the gate dielectric structure. The gate dielectric includes a ferroelectric or antiferroelectric polycrystalline material layer 202A. The gate electrode has a conductive layer 202B on the ferroelectric or antiferroelectric polycrystalline material layer 202A. The conductive layer 202B includes a metal and may be a barrier layer, a workfunction layer, and/or templating layer enhancing crystallization of FE/AFE layers. A gate fill layer or layer(s) 202C is on or above the conductive layer 202B. A source region 208 and a drain region 210 are on opposite sides of the gate structure 202.

Source or drain contacts 212 are electrically connected to the source region 208 and the drain region 210 at locations 249, and are spaced apart of the gate structure 202 by one or both of an inter-layer dielectric layer 214 or gate dielectric spacers 216. In the example of FIG. 2A, the source region 208 and the drain region 210 are regions of the substrate 204. In an embodiment, the source or drain contacts 212 include a barrier layer 212A, and a conductive trench fill material 212B. In one embodiment, the ferroelectric or antiferroelectric polycrystalline material layer 202A extends along the dielectric spacers 216, as is depicted in FIG. 2A.

In an embodiment, and as applicable throughout the disclosure, the ferroelectric or antiferroelectric polycrystalline material layer 202A is a ferroelectric polycrystalline material layer. In one embodiment, the ferroelectric polycrystalline material layer is an oxide including Zr and Hf with a Zr:Hf ratio of 50:50 or greater in Zr. The ferroelectric effect may increase as the orthorhombic crystallinity increases. In one embodiment ferroelectric polycrystalline material layer has at least 80% orthorhombic crystallinity.

In an embodiment, and as applicable throughout the disclosure, the ferroelectric or antiferroelectric polycrystalline material layer 202A is an antiferroelectric polycrystalline material layer. In one embodiment, the antiferroelectric polycrystalline material layer is an oxide including Zr and Hf with a Zr:Hf ratio of 80:20 or greater in Zr, and even up to 100% Zr, $ZrO_2$. In one embodiment, the antiferroelectric polycrystalline material layer has at least 80% tetragonal crystallinity.

In an embodiment, and as applicable throughout the disclosure, the gate dielectric of gate stack 202 further includes an amorphous dielectric layer 203, such as a native silicon oxide layer, high K dielectric (HfOx, $Al2O_3$, etc), or combination of oxide and high K between the ferroelectric or antiferroelectric polycrystalline material layer 202A and the semiconductor channel structure 206. In an embodiment, and as applicable throughout the disclosure, the ferroelectric or antiferroelectric polycrystalline material layer 202A has a thickness in the range of 1 nanometer to 8 nanometers. In an embodiment, and as applicable throughout the disclosure, the ferroelectric or antiferroelectric polycrystalline material layer 202A has a crystal grain size approximately in the range of 20 or more nanometers.

In an embodiment, following deposition of the ferroelectric or antiferroelectric polycrystalline material layer 202A, e.g., by atomic layer deposition (ALD), a layer including a metal (e.g., layer 202B, such as a 5-10 nanometer titanium nitride or tantalum nitride or tungsten) is formed on the ferroelectric or antiferroelectric polycrystalline material layer 202A. An anneal is then performed. In one embodiment, the anneal is performed for a duration in the range of 1 millisecond-30 minutes. In one embodiment, the anneal is performed at a temperature in the range of 500-1100 degrees Celsius.

Figure 2B:
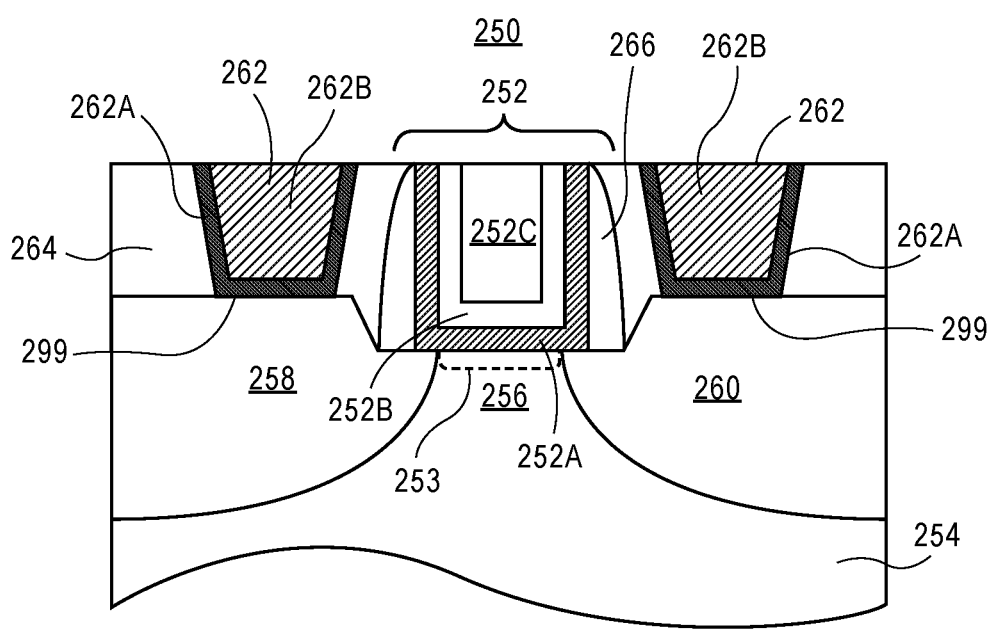
FIG. 2B illustrates a cross-sectional view of another semiconductor device having a ferroelectric or antiferroelectric gate dielectric structure, in accordance with another embodiment of the present disclosure.

FIG. 2B illustrates a cross-sectional view of another semiconductor device having a ferroelectric or antiferroelectric gate dielectric structure, in accordance with another embodiment of the present disclosure.

Referring to FIG. 2B, an integrated circuit structure 250 includes a gate structure 252 above a substrate 254. In one embodiment, the gate structure 252 is above or over a semiconductor channel structure 256 including a monocrystalline material, such as monocrystalline silicon. The gate structure 252 includes a gate dielectric over the semiconductor channel structure 256 and a gate electrode over the gate dielectric structure. The gate dielectric includes a ferroelectric or antiferroelectric polycrystalline material layer 252A, and may further include an amorphous oxide layer 253. The gate electrode has a conductive layer 252B on the ferroelectric or antiferroelectric polycrystalline material layer 252A. The conductive layer 252B includes a metal and may be a barrier layer or a workfunction layer. A gate fill layer or layer(s) 252C is on or above the conductive layer 252B. A raised source region 258 and a raised drain region 260, such as regions of semiconductor material different than the semiconductor channel structure 256, are on opposite sides of the gate structure 252. Source or drain contacts 262 are electrically connected to the source region 258 and the drain region 260 at locations 299, and are spaced apart of the gate structure 252 by one or both of an inter-layer dielectric layer 264 or gate dielectric spacers 266. In an embodiment, the source or drain contacts 262 include a barrier layer 262A, and a conductive trench fill material 262B. In one embodiment, the ferroelectric or antiferroelectric polycrystalline material layer 252A extends along the dielectric spacers 266, as is depicted in FIG. 2B.

Figure 3A:
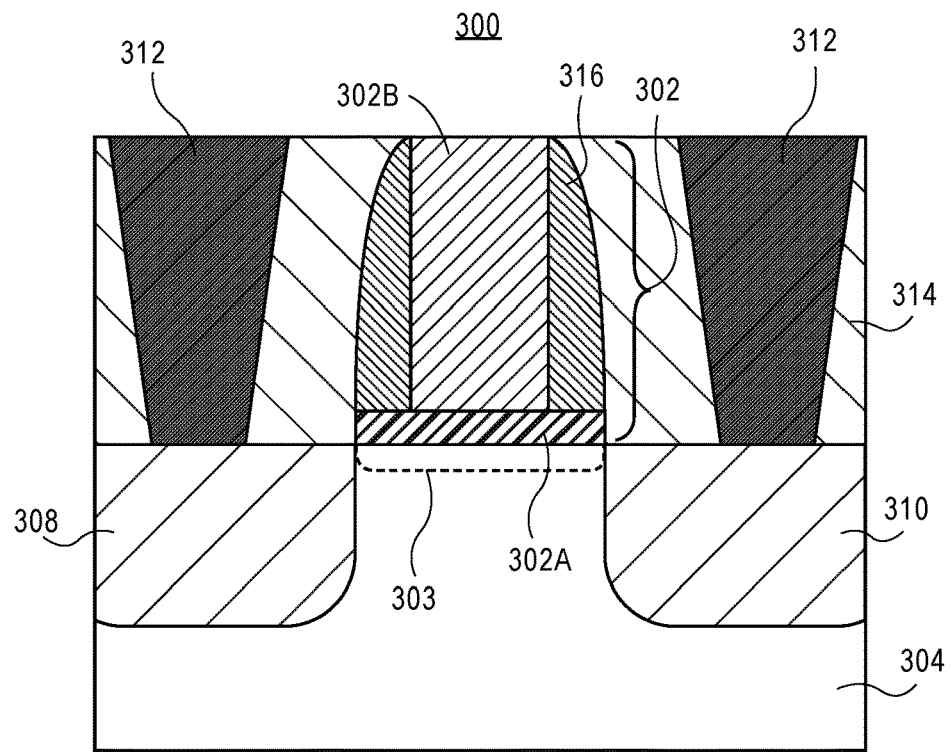
FIG. 3A illustrates a cross-sectional view of another semiconductor device having a ferroelectric or antiferroelectric gate dielectric structure, in accordance with another embodiment of the present disclosure.

FIG. 3A illustrates a cross-sectional view of another semiconductor device having a ferroelectric or antiferroelectric gate dielectric structure, in accordance with another embodiment of the present disclosure.

Referring to FIG. 3A, an integrated circuit structure 300 includes a gate structure 302 above a substrate 304. The gate structure 302 includes a gate dielectric over a semiconductor channel structure and a gate electrode over the gate dielectric structure. The gate dielectric includes a ferroelectric or antiferroelectric polycrystalline material layer 302A, and may further include an amorphous oxide layer 303. The gate electrode has a conductive layer 302B on the ferroelectric or antiferroelectric polycrystalline material layer 302A. The conductive layer 302B includes a metal on the antiferroelectric polycrystalline material layer 302A and may be a barrier layer or a workfunction layer, templating layer or a fill layer. A source region 308 and a drain region 310 are on opposite sides of the gate structure 302. Source or drain contacts 312 are electrically connected to the source region 308 and the drain region 310, and are spaced apart from the gate structure 302 by one or both of an inter-layer dielectric layer 314 or gate dielectric spacers 316. In one embodiment, the ferroelectric or antiferroelectric polycrystalline material layer 302A extends beneath the first and second dielectric spacers 316, as is depicted in FIG. 3A.

Figure 3B:
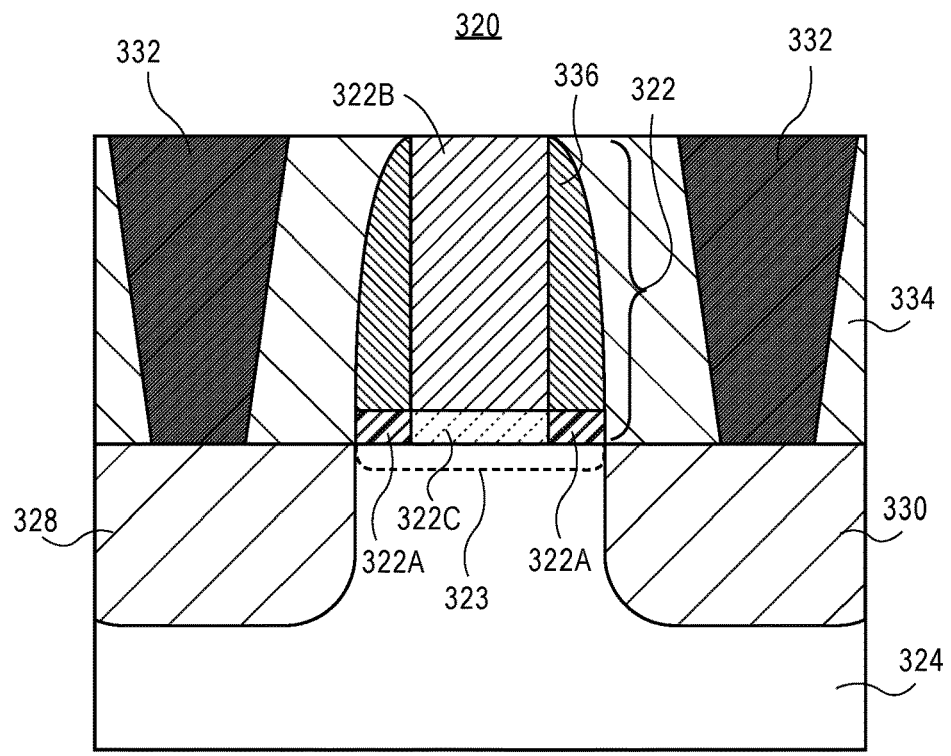
FIG. 3B illustrates a cross-sectional view of another semiconductor device having a ferroelectric or antiferroelectric gate dielectric structure, in accordance with another embodiment of the present disclosure.

FIG. 3B illustrates a cross-sectional view of another semiconductor device having a ferroelectric or antiferroelectric gate dielectric structure, in accordance with another embodiment of the present disclosure.

Referring to FIG. 3B, an integrated circuit structure 320 includes a semiconductor channel structure, such as a region or structure within or above a substrate 324. The semiconductor channel structure may include a monocrystalline material. A gate stack 322 is over the semiconductor channel structure. The gate stack includes a gate dielectric 322C on or above the semiconductor channel structure, and a gate electrode 322B on the gate dielectric 322C. A layer of amorphous oxide 323 may be between the gate dielectric 322C and the semiconductor channel structure. A first source or drain structure 328 is at a first side of the gate electrode 322B. A first dielectric spacer (left 336) is between the first source or drain structure 328 and the first side of the gate electrode 322B. A second source or drain structure 330 is at a second side of the gate electrode 322B opposite the first side. A second dielectric spacer (right 336) is between the second source or drain structure 330 and the second side of the gate electrode 322B. A ferroelectric or antiferroelectric polycrystalline material layer 322A is beneath the first and second dielectric spacers 336 and adjacent the gate dielectric 322C. Source or drain contacts 332 are electrically connected to the source region 328 and the drain region 330, and are spaced apart from the gate structure 322B by one or both of an inter-layer dielectric layer 334 or the gate dielectric spacers 336.

In an embodiment, the ferroelectric or antiferroelectric polycrystalline material layer 322A is an oxide including Zr and Hf, and the gate dielectric 322C includes a layer of amorphous hafnium oxide. In one embodiment, the ferroelectric or antiferroelectric polycrystalline material layer 322A has at least 80% orthorhombic crystallinity. In one embodiment, the ferroelectric or antiferroelectric polycrystalline material layer 322A has at least 80% tetragonal crystallinity.

Figure 3C:
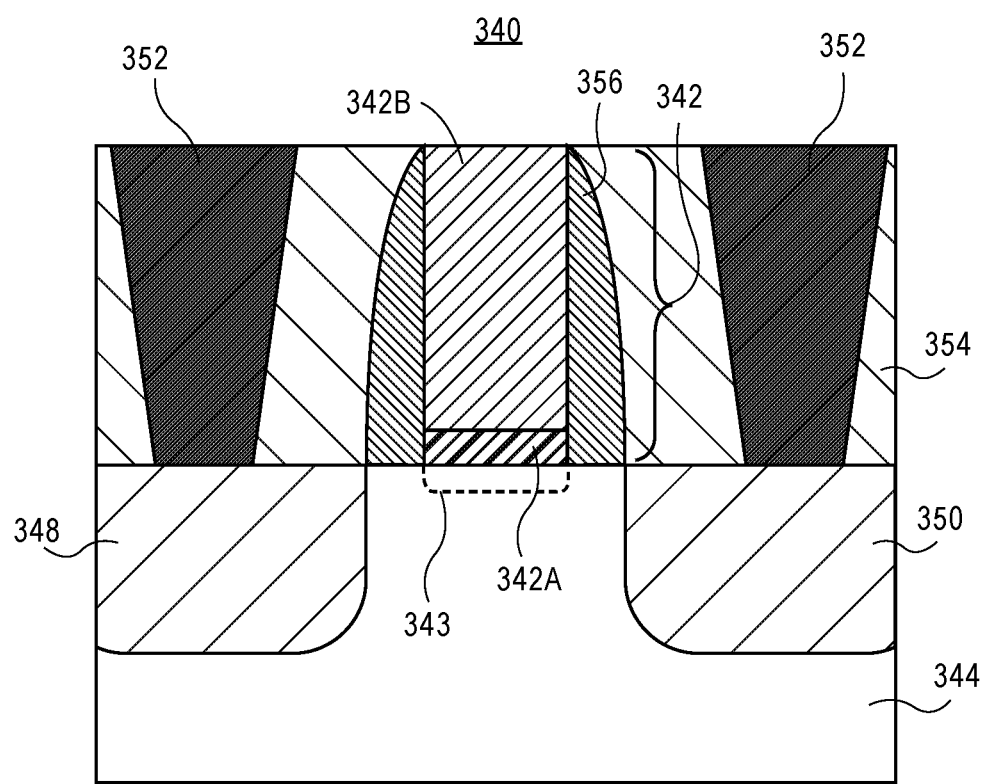
FIG. 3C illustrates a cross-sectional view of another semiconductor device having a ferroelectric or antiferroelectric gate dielectric structure, in accordance with another embodiment of the present disclosure.

FIG. 3C illustrates a cross-sectional view of another semiconductor device having a ferroelectric or antiferroelectric gate dielectric structure, in accordance with another embodiment of the present disclosure.

Referring to FIG. 3C, an integrated circuit structure 340 includes a gate structure 342 above a substrate 344. The gate structure 342 includes a gate dielectric over a semiconductor channel structure and a gate electrode over the gate dielectric structure. The gate dielectric includes a ferroelectric or antiferroelectric polycrystalline material layer 342A, and may further include an amorphous oxide layer 343. The gate electrode has a conductive layer 342B on the ferroelectric or antiferroelectric polycrystalline material layer 342A. The conductive layer 342B includes a metal on the antiferroelectric polycrystalline material layer 342A and may be a barrier layer or a workfunction layer or a fill layer. A source region 348 and a drain region 350 are on opposite sides of the gate structure 342. Source or drain contacts 352 are electrically connected to the source region 348 and the drain region 350, and are spaced apart from the gate structure 342 by one or both of an inter-layer dielectric layer 354 or gate dielectric spacers 356. In one embodiment, the ferroelectric or antiferroelectric polycrystalline material layer 342A is confined to a location the first and second dielectric spacers 316, as is depicted in FIG. 3C.

Figure 4:
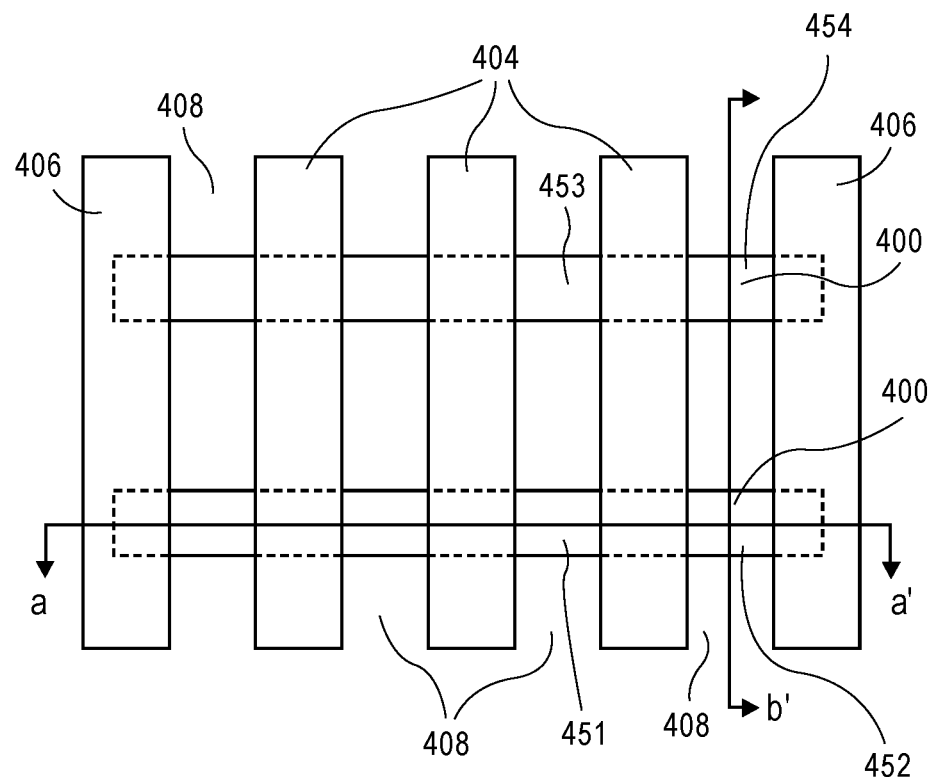
FIG. 4 illustrates a plan view of a plurality of gate lines over a pair of semiconductor fins, in accordance with an embodiment of the present disclosure.

FIG. 4 illustrates a plan view of a plurality of gate lines over a pair of semiconductor fins, in accordance with another embodiment of the present disclosure.

Referring to FIG. 4, a plurality of active gate lines 404 is formed over a plurality of semiconductor fins 400. Dummy gate lines 406 are at the ends of the plurality of semiconductor fins 400. Spacings 408 between the gate lines 404/406 are locations where trench contacts may be located to provide conductive contacts to source/drain regions, such as source/drain regions 451, 452, 453, and 454.

In an embodiment, the pattern of the plurality of gate lines 404/406 and/or the pattern of the plurality of semiconductor fins 400 is described as a grating structure. In an embodiment, the term "grating" for the plurality of gate lines 404/406 and/or the pattern of the plurality of semiconductor fins 400 is used herein to refer to a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, the grating-like patterns described herein may have the plurality of gate lines 404/406 and/or the pattern of the plurality of semiconductor fins 400 spaced at a constant pitch and having a constant width. The pattern may be fabricated by a pitch halving or pitch quartering, or other pitch division, approach.

Figure 5:
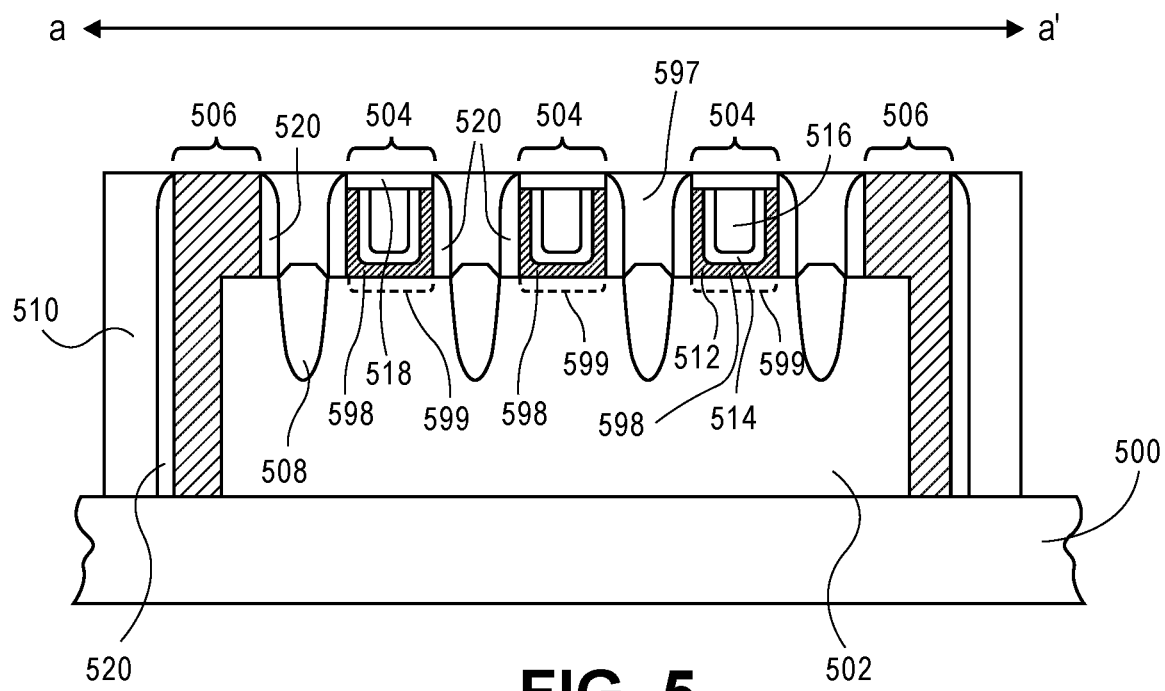
FIG. 5 illustrates a cross-sectional view, taken along the a-a' axis of FIG. 4, in accordance with an embodiment of the present disclosure.

FIG. 5 illustrates a cross-sectional view, taken along the a-a' axis of FIG. 4, in accordance with an embodiment of the present disclosure.

Referring to FIG. 5, a plurality of active gate lines 504 is formed over a semiconductor fin 502 formed above a substrate 500. Dummy gate lines 506 are at the ends of the semiconductor fin 502. A dielectric layer 510 is outside of the dummy gate lines 506. A trench contact material 597 is between the active gate lines 504, and between the dummy gate lines 506 and the active gate lines 504. Embedded source/drain structures 508 are in the semiconductor fin 502 between the active gate lines 504 and between the dummy gate lines 506 and the active gate lines 504.

The active gate lines 504 include a gate dielectric structure 512, a workfunction gate electrode portion 514 and a fill gate electrode portion 516, and a dielectric capping layer 518. Dielectric spacers 520 line the sidewalls of the active gate lines 504 and the dummy gate lines 506. In an embodiment, the gate dielectric structure 512 includes a ferroelectric or antiferroelectric polycrystalline material layer 598. In one embodiment, the gate dielectric structure 512 further includes an amorphous oxide layer 599.

Figure 6:
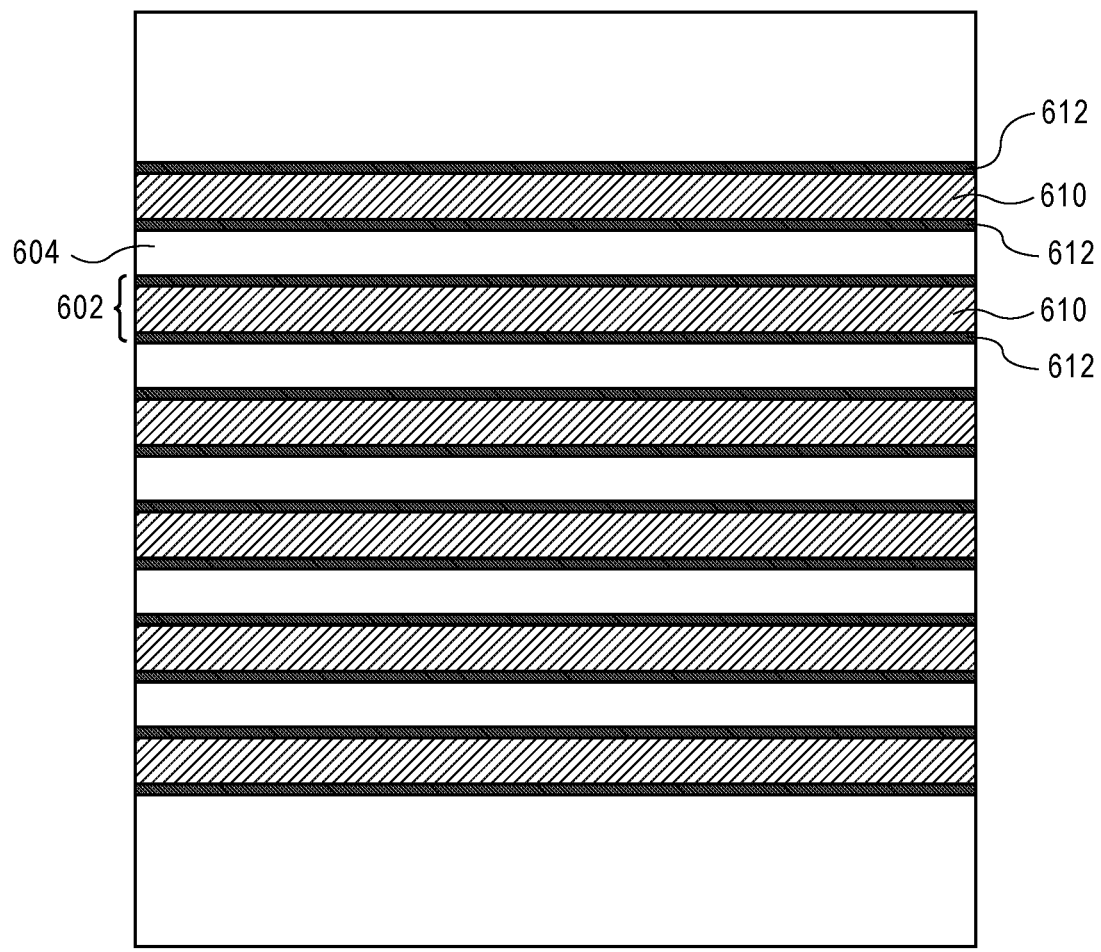
FIG. 6 illustrates a plan view and corresponding cross-sectional view of a metallization layer of an integrated circuit structure, in accordance with an embodiment of the present disclosure.
Figure 6:
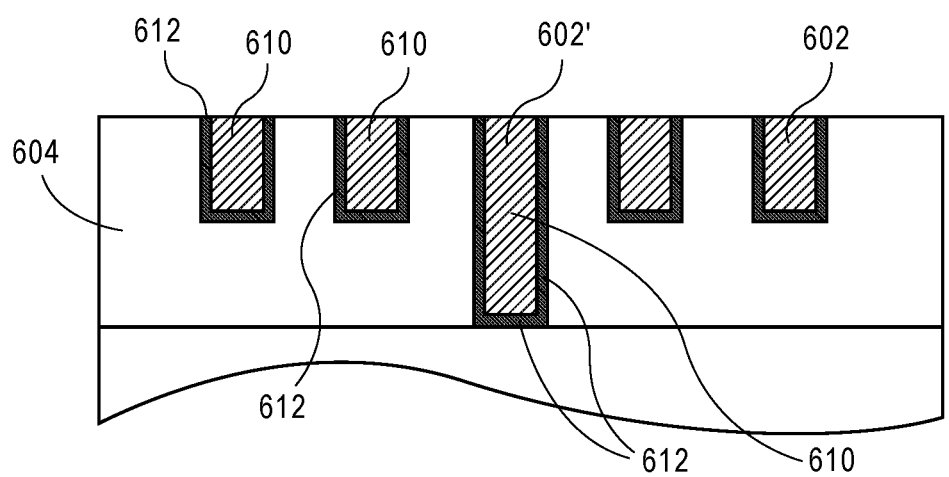

FIG. 6 illustrates a plan view and corresponding cross-sectional view of a metallization layer of an integrated circuit structure that may be fabricated above and may interconnect field effect transistors having a ferroelectric or antiferroelectric gate dielectric structure, in accordance with an embodiment of the present disclosure.

Referring to FIG. 6, a metallization layer 600 includes a pattern of conductive lines 602 and interlayer dielectric (ILD) lines 604. The metallization layer 600 may be patterned in a grating-like pattern with conductive lines 602 spaced at a constant pitch and having a constant width, as is depicted in FIG. 6. Although not shown, the conductive lines 602 may have interruptions (i.e., cuts or plugs) at various locations along the lines. Some of the conductive lines may be associated with underlying vias, such as line 602' shown as an example in the cross-sectional view.

In an embodiment, the term "grating" for conductive lines 602 and ILD lines 604 is used herein to refer to a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, the grating-like patterns described herein may have conductive lines 602 and/or ILD lines 604 spaced at a constant pitch and having a constant width. The pattern may be fabricated by a pitch halving or pitch quartering, or other pitch division, approach.

In an embodiment, the conductive lines 602 (and, possibly, underlying via structures) are composed of one or more metal or other conductive structures. The conductive lines 602 are also sometimes referred to in the art as traces, wires, lines, metal, interconnect lines or simply interconnects. In a particular embodiment, each of the conductive lines 602 includes a barrier layer 612 and a conductive fill material 610. In an embodiment, the barrier layer 612 is a titanium nitride or tantalum nitride barrier layer. In an embodiment, the conductive fill material 610 is composed of a conductive material such as, but not limited to, Cu, Al, Ti, Zr, Hf, V, Ru, Co, Ni, Pd, Pt, W, Ag, Au or alloys thereof.

In an embodiment, ILD lines 604 are composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

It is to be appreciated that the layers and materials described in association with FIG. 6 are typically formed on or above an underlying semiconductor substrate or structure, such as underlying device layer(s) of an integrated circuit. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, although not depicted, the structure depicted in FIG. 6 may be fabricated on underlying lower level back end of line (BEOL) interconnect layers.

Figure 7A:
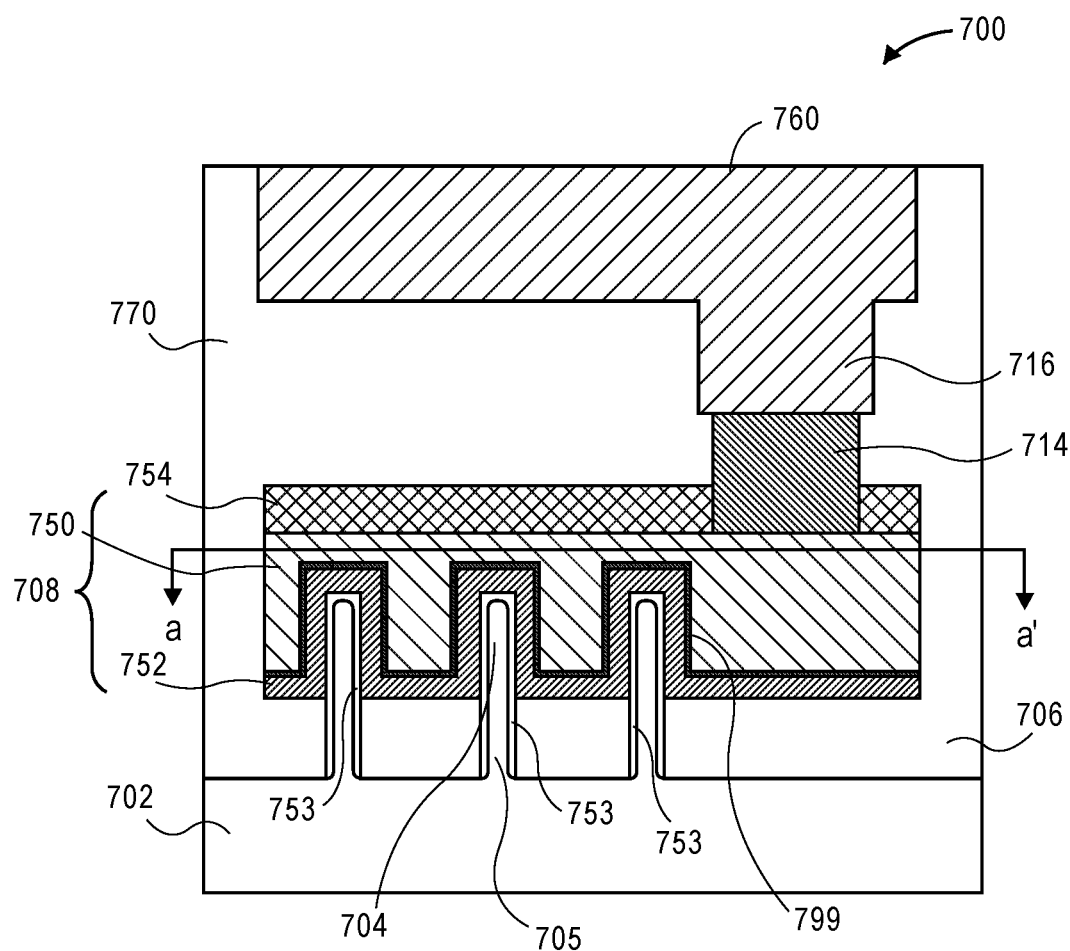
FIG. 7A illustrates a cross-sectional view of a non-planar semiconductor device having a ferroelectric or antiferroelectric gate dielectric structure, in accordance with an embodiment of the present disclosure.
Figure 7B:
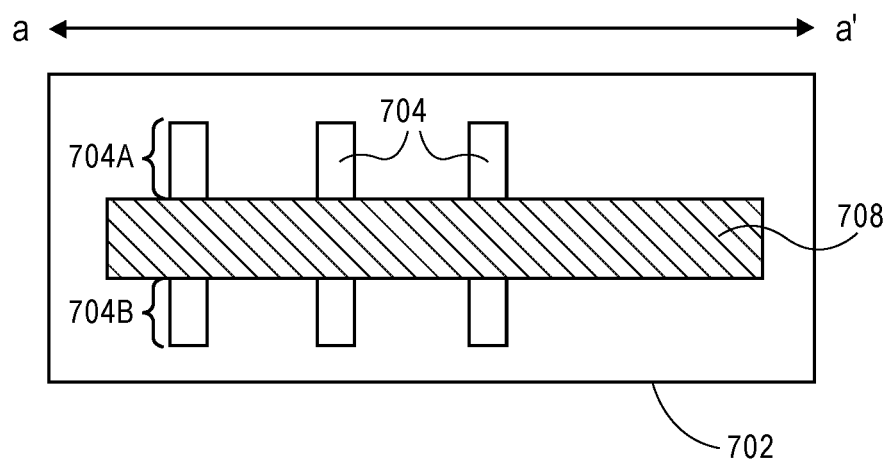
FIG. 7B illustrates a plan view taken along the a-a' axis of the semiconductor device of FIG. 7A, in accordance with an embodiment of the present disclosure.

One or more embodiments described herein are directed to fabricating semiconductor devices, such as for metal oxide semiconductor (MOS) device fabrication. As an example, FIG. 7A illustrates a cross-sectional view of a non-planar semiconductor device having a ferroelectric or antiferroelectric gate dielectric structure. FIG. 7B illustrates a plan view taken along the a-a' axis of the semiconductor device of FIG. 7A, in accordance with an embodiment of the present disclosure.

Referring to FIG. 7A, a semiconductor structure or device 700 includes a non-planar active region (e.g., a fin structure including protruding fin portion 704 and sub-fin region 705) formed from substrate 702, and within isolation region 706. A gate line 708 is disposed over the protruding portions 704 of the non-planar active region as well as over a portion of the isolation region 706. As shown, gate line 708 includes a gate electrode 750/799 and a gate dielectric structure 752/753. In one embodiment, gate line 708 may also include a dielectric cap layer 754. A gate contact 714, and overlying gate contact via 716 are also seen from this perspective, along with an overlying metal interconnect 760, all of which are disposed in inter-layer dielectric stacks or layers 770. Also seen from the perspective of FIG. 7A, the gate contact 714 is, in one embodiment, disposed over isolation region 706, but not over the non-planar active regions.

Referring to FIG. 7B, the gate line 708 is shown as disposed over the protruding fin portions 704. Source and drain regions 704A and 704B of the protruding fin portions 704 can be seen from this perspective. In one embodiment, the source and drain regions 704A and 704B are doped portions of original material of the protruding fin portions 704. In another embodiment, the material of the protruding fin portions 704 is removed and replaced with another semiconductor material, e.g., by epitaxial deposition. In either case, the source and drain regions 704A and 704B may extend below the height of dielectric layer 706, i.e., into the sub-fin region 705.

In an embodiment, the semiconductor structure or device 700 is a non-planar device such as, but not limited to, a fin-FET or a tri-gate device. In such an embodiment, a corresponding semiconducting channel region is composed of or is formed in a three-dimensional body. In one such embodiment, the gate electrode and gate electrode materials of gate lines 708 surround at least a top surface and a pair of sidewalls of the three-dimensional body.

Substrate 702 may be composed of a semiconductor material that can withstand a manufacturing process and in which charge can migrate. In an embodiment, substrate 702 is a bulk substrate composed of a crystalline silicon, silicon/germanium or germanium layer doped with a charge carrier, such as but not limited to phosphorus, arsenic, antimony, boron, gallium or a combination thereof, to form active region 704. In one embodiment, the concentration of silicon atoms in bulk substrate 702 is greater than 97%. In another embodiment, bulk substrate 702 is composed of an epitaxial layer grown atop a distinct crystalline substrate, e.g. a silicon epitaxial layer grown atop a boron-doped bulk silicon monocrystalline substrate. Bulk substrate 702 may alternatively be composed of a group III-V material. In an embodiment, bulk substrate 702 is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, bulk substrate 702 is composed of a III-V material and the charge-carrier dopant impurity atoms are ones such as, but not limited to, magnesium, beryllium, zinc, carbon, silicon, germanium, oxygen, sulfur, selenium or tellurium.

Isolation region 706 may be composed of a material suitable to ultimately electrically isolate, or contribute to the isolation of, portions of a permanent gate structure from an underlying bulk substrate or isolate active regions formed within an underlying bulk substrate, such as isolating fin active regions. For example, in one embodiment, the isolation region 706 is composed of a dielectric material such as, but not limited to, silicon dioxide, silicon oxy-nitride, silicon nitride, or carbon-doped silicon nitride.

In an embodiment, the gate dielectric structure includes a ferroelectric or antiferroelectric polycrystalline material layer 752. In one embodiment, the gate dielectric structure further includes an amorphous oxide layer 753. In some implementations, the ferroelectric or antiferroelectric polycrystalline material layer 752 may consist of a "U"-shaped structure that includes a bottom portion substantially parallel to the surface of the substrate and two sidewall portions that are substantially perpendicular to the top surface of the substrate.

In an embodiment, layer 750 of the gate electrode 750/799 is composed of a non-workfunction-setting conductive fill material formed above a workfunction-setting layer 799. In one such embodiment, the conductive fill material 750 includes a material such as but not limited to, tungsten (W), aluminum (Al), or copper (Cu). For a PMOS transistor, metals that may be used for the workfunction-setting layer 799 include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the workfunction-setting layer 799 include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the workfunction-setting layer 799 may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In an embodiment, the dielectric cap layer 754 and/or dielectric spacers associated with the gate electrode stacks may be composed of a material suitable to ultimately electrically isolate, or contribute to the isolation of, a permanent gate structure from adjacent or overlying conductive contacts, such as self-aligned contacts. For example, in one embodiment, the dielectric cap layer 754 and/or dielectric spacers are composed of a dielectric material such as, but not limited to, silicon dioxide, silicon oxy-nitride, silicon nitride, or carbon-doped silicon nitride.

Gate contact 714, overlying gate contact via 716, and/or overlying metal interconnect 760 may be composed of a conductive material. In an embodiment, one or more of the contacts, interconnects or vias are composed of a metal species. The metal species may be a pure metal, such as tungsten, nickel, or cobalt, or may be an alloy such as a metal-metal alloy or a metal-semiconductor alloy (e.g., such as a silicide material). In a particular embodiment, one or more of gate contact 714, overlying gate contact via 716, or overlying metal interconnect 760 includes a barrier layer and a conductive fill material. In one such embodiment, the barrier layer is a tantalum nitride layer or a titanium nitride layer. In an embodiment, the conductive fill material is composed of a conductive material such as, but not limited to, Cu, Al, Ti, Zr, Hf, V, Ru, Co, Ni, Pd, Pt, W, Ag, Au or alloys thereof.

In an embodiment (although not shown), providing structure 700 involves formation of a contact pattern which is essentially perfectly aligned to an existing gate pattern while eliminating the use of a lithographic step with exceedingly tight registration budget. In one such embodiment, this approach enables the use of intrinsically highly selective wet etching (e.g., versus conventionally implemented dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in conventional approaches. In an embodiment, a trench contact grid is not separately patterned, but is rather formed between poly (gate) lines. For example, in one such embodiment, a trench contact grid is formed subsequent to gate grating patterning but prior to gate grating cuts.

Furthermore, the gate stack structure 708 may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to arrive at structure 700. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

Referring again to FIG. 7A, the arrangement of semiconductor structure or device 700 places the gate contact over isolation regions. Such an arrangement may be viewed as inefficient use of layout space in certain applications. In another embodiment, however, a semiconductor device has contact structures that contact portions of a gate electrode formed over an active region. In general, prior to (e.g., in addition to) forming a gate contact structure (such as a via) over an active portion of a gate and in a same layer as a trench contact via, one or more embodiments of the present disclosure include first using a gate aligned trench contact process. Such a process may be implemented to form trench contact structures for semiconductor structure fabrication, e.g., for integrated circuit fabrication. In an embodiment, a trench contact pattern is formed as aligned to an existing gate pattern. By contrast, conventional approaches typically involve an additional lithography process with tight registration of a lithographic contact pattern to an existing gate pattern in combination with selective contact etches. For example, a conventional process may include patterning of a poly (gate) grid with separate patterning of contact features.

It is to be appreciated that not all aspects of the processes described above need be practiced to fall within the spirit and scope of embodiments of the present disclosure. For example, in one embodiment, dummy gates need not ever be formed prior to fabricating gate contacts over active portions of the gate stacks. The gate stacks described above may actually be permanent gate stacks as initially formed. Also, the processes described herein may be used to fabricate one or a plurality of semiconductor devices. The semiconductor devices may be transistors or like devices. For example, in an embodiment, the semiconductor devices are a metal-oxide semiconductor (MOS) transistors for logic or memory, or are bipolar transistors. Also, in an embodiment, the semiconductor devices have a three-dimensional architecture, such as a trigate device, an independently accessed double gate device, or a FIN-FET. One or more embodiments may be particularly useful for fabricating semiconductor devices at a 10 nanometer (10 nm) or smaller technology node.

In an embodiment, as is also used throughout the present description, lithographic operations are performed using 193 nm immersion lithography (i193), extreme ultra-violet (EUV) and/or electron beam direct write (EBDW) lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 8:
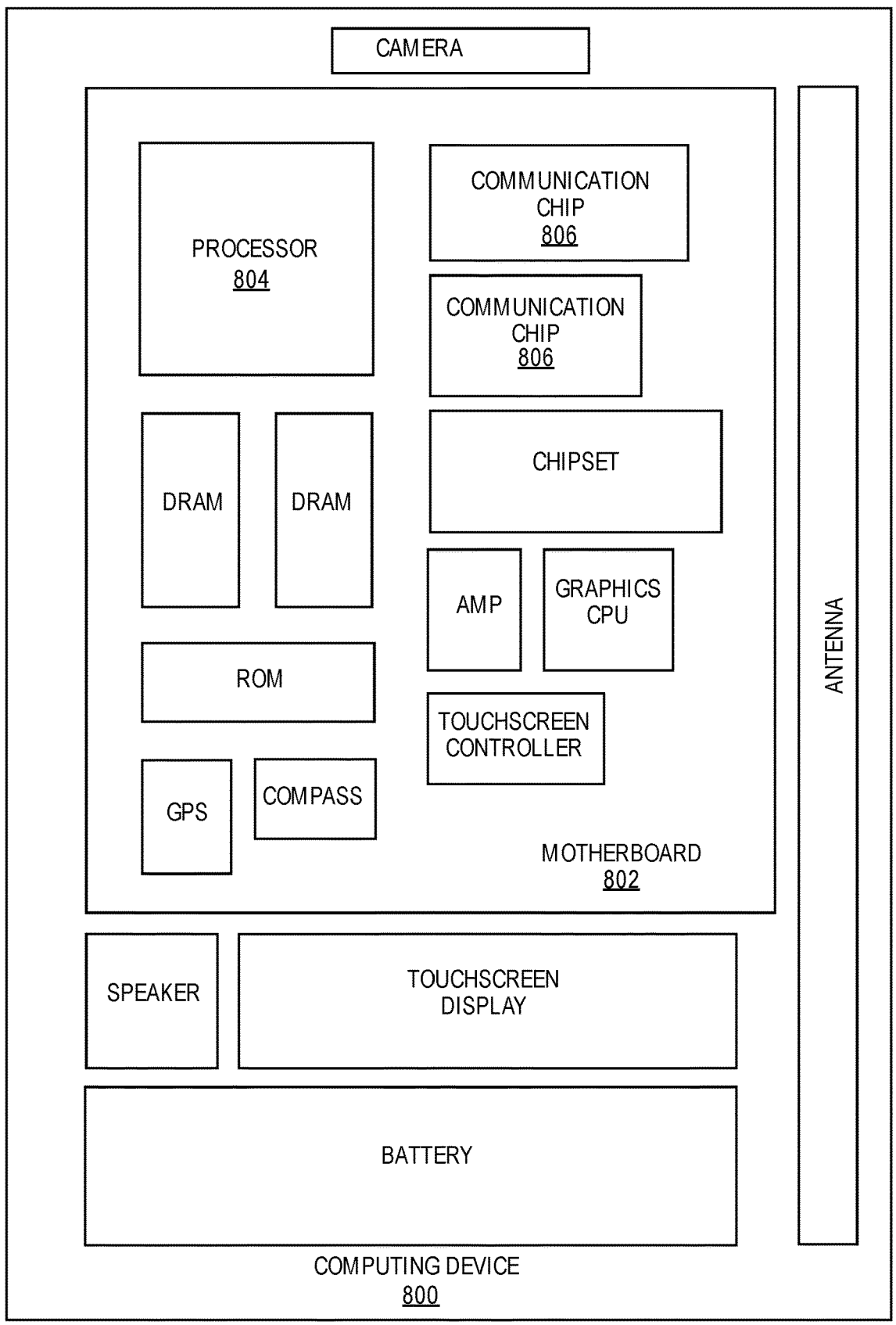
FIG. 8 illustrates a computing device in accordance with one implementation of an embodiment of the disclosure.

FIG. 8 illustrates a computing device 800 in accordance with one implementation of the disclosure. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

Depending on its applications, computing device 800 may include other components that may or may not be physically and electrically coupled to the board 802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the disclosure, the integrated circuit die of the processor includes one or more field effect transistors having a ferroelectric or antiferroelectric gate dielectric structure, in accordance with implementations of embodiments of the disclosure. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of embodiments of the disclosure, the integrated circuit die of the communication chip includes one or more field effect transistors having a ferroelectric or antiferroelectric gate dielectric structure, in accordance with implementations of embodiments of the disclosure.

In further implementations, another component housed within the computing device 800 may contain an integrated circuit die that includes one or more field effect transistors having a ferroelectric or antiferroelectric gate dielectric structure, in accordance with implementations of embodiments of the disclosure.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Figure 9:
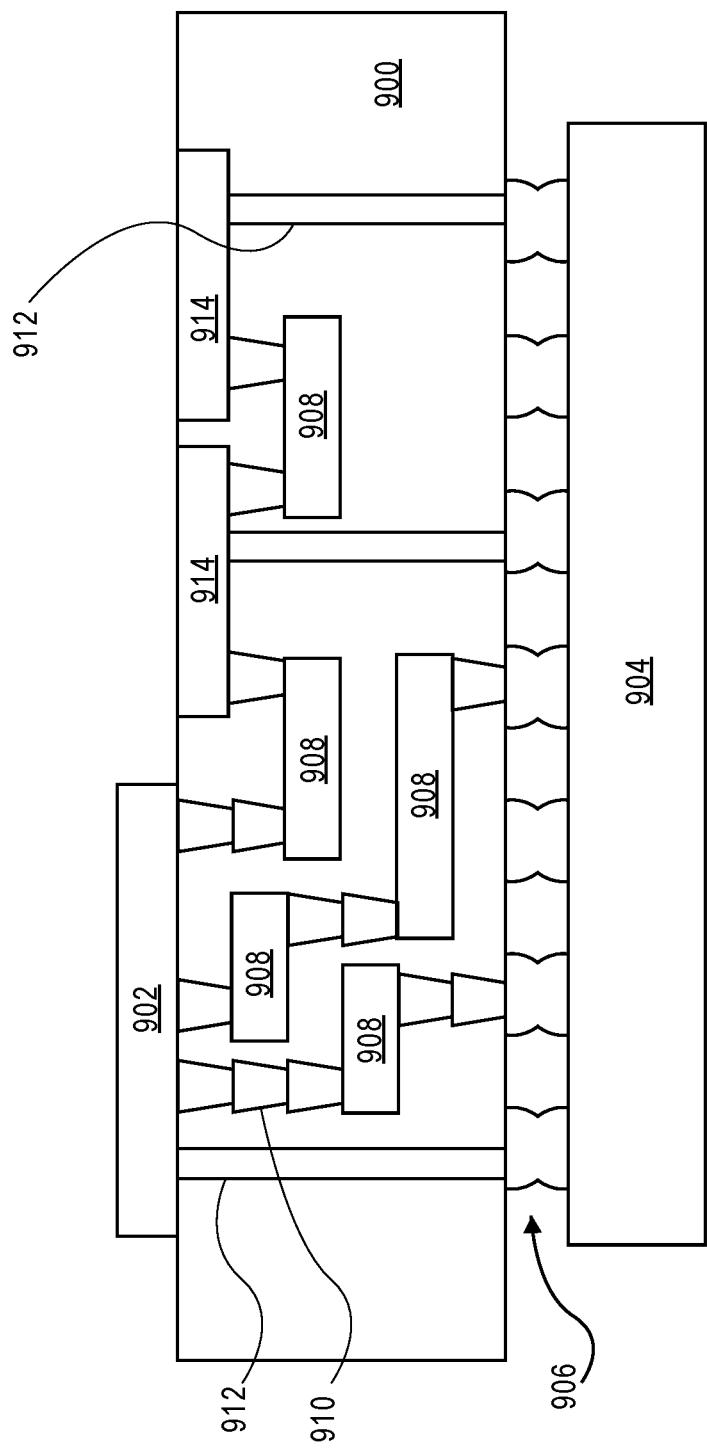
FIG. 9 is an interposer implementing one or more embodiments of the disclosure.

FIG. 9 illustrates an interposer 900 that includes one or more embodiments of the disclosure. The interposer 900 is an intervening substrate used to bridge a first substrate 902 to a second substrate 904. The first substrate 902 may be, for instance, an integrated circuit die. The second substrate 904 may be, for instance, a memory module, a computer motherboard, or another integrated circuit die. Generally, the purpose of an interposer 900 is to spread a connection to a wider pitch or to reroute a connection to a different connection. For example, an interposer 900 may couple an integrated circuit die to a ball grid array (BGA) 906 that can subsequently be coupled to the second substrate 904. In some embodiments, the first and second substrates 902/904 are attached to opposing sides of the interposer 900. In other embodiments, the first and second substrates 902/904 are attached to the same side of the interposer 900. And in further embodiments, three or more substrates are interconnected by way of the interposer 900.

The interposer 900 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 908 and vias 910, including but not limited to through-silicon vias (TSVs) 912. The interposer 900 may further include embedded devices 914, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 900. In accordance with embodiments of the disclosure, apparatuses or processes disclosed herein may be used in the fabrication of interposer 900.

Thus, embodiments described herein include field effect transistors having a ferroelectric or antiferroelectric gate dielectric structure.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: An integrated circuit structure includes a semiconductor channel structure includes a monocrystalline material. A gate dielectric is over the semiconductor channel structure. The gate dielectric includes a ferroelectric or antiferroelectric polycrystalline material layer. A gate electrode has a conductive layer on the ferroelectric or antiferroelectric polycrystalline material layer, the conductive layer including a metal. A first source or drain structure is at a first side of the gate electrode. A second source or drain structure is at a second side of the gate electrode opposite the first side.

Example embodiment 2: The integrated circuit structure of example embodiment 1, wherein the ferroelectric or antiferroelectric polycrystalline material layer is a ferroelectric polycrystalline material layer.

Example embodiment 3: The integrated circuit structure of example embodiment 2, wherein the ferroelectric polycrystalline material layer is an oxide including Zr and Hf with a Zr:Hf ratio of 50:50 or greater in Zr.

Example embodiment 4: The integrated circuit structure of example embodiment 2 or 3, wherein the ferroelectric polycrystalline material layer has at least 80% orthorhombic crystallinity.

Example embodiment 5: The integrated circuit structure of example embodiment 1, wherein the ferroelectric or antiferroelectric polycrystalline material layer is an antiferroelectric polycrystalline material layer.

Example embodiment 6: The integrated circuit structure of example embodiment 5, wherein the antiferroelectric polycrystalline material layer is an oxide including Zr and Hf with a Zr:Hf ratio of 80:20 or greater in Zr.

Example embodiment 7: The integrated circuit structure of example embodiment 5 or 6, wherein the antiferroelectric polycrystalline material layer has at least 80% tetragonal crystallinity.

Example embodiment 8: The integrated circuit structure of example embodiment 1, 2, 3, 4, 5, 6 or 7, wherein the gate dielectric further includes an amorphous oxide layer between the ferroelectric or antiferroelectric polycrystalline material layer and the semiconductor channel structure.

Example embodiment 9: An integrated circuit structure includes a semiconductor channel structure includes a monocrystalline material. A gate dielectric is over the semiconductor channel structure. The gate dielectric includes a ferroelectric or antiferroelectric polycrystalline material layer. A gate electrode has a conductive layer on the ferroelectric or antiferroelectric polycrystalline material layer, the conductive layer including a metal. A first source or drain structure is at a first side of the gate electrode. A first dielectric spacer is between the first source or drain structure and the first side of the gate electrode. A second source or drain structure is at a second side of the gate electrode opposite the first side. A second dielectric spacer between the second source or drain structure and the second side of the gate electrode.

Example embodiment 10: The integrated circuit structure of example embodiment 9, wherein the ferroelectric or antiferroelectric polycrystalline material layer extends along the first dielectric spacer and the second dielectric spacer.

Example embodiment 11: The integrated circuit structure of example embodiment 9, wherein the ferroelectric or antiferroelectric polycrystalline material layer extends beneath the first dielectric spacer and the second dielectric spacer.

Example embodiment 12: The integrated circuit structure of example embodiment 9, 10 or 11, wherein the ferroelectric or antiferroelectric polycrystalline material layer is a ferroelectric polycrystalline material layer.

Example embodiment 13: The integrated circuit structure of example embodiment 12, wherein the ferroelectric polycrystalline material layer is an oxide including Zr and Hf with a Zr:Hf ratio of 50:50 or greater in Zr.

Example embodiment 14: The integrated circuit structure of example embodiment 12 or 13, wherein the ferroelectric polycrystalline material layer has at least 80% orthorhombic crystallinity.

Example embodiment 15: The integrated circuit structure of example embodiment 9, 10 or 11, wherein the ferroelectric or antiferroelectric polycrystalline material layer is an antiferroelectric polycrystalline material layer.

Example embodiment 16: The integrated circuit structure of example embodiment 15, wherein the antiferroelectric polycrystalline material layer is an oxide including Zr and Hf with a Zr:Hf ratio of 80:20 or greater in Zr.

Example embodiment 17: The integrated circuit structure of example embodiment 15 or 16, wherein the antiferroelectric polycrystalline material layer has at least 80% tetragonal crystallinity.

Example embodiment 18: The integrated circuit structure of example embodiment 9, 10, 11, 12, 13, 14, 15, 16 or 17, wherein the gate dielectric further includes an amorphous oxide layer between the ferroelectric or antiferroelectric polycrystalline material layer and the semiconductor channel structure.

Example embodiment 19: An integrated circuit structure includes a semiconductor channel structure including a monocrystalline material. A gate dielectric is over the semiconductor channel structure. A gate electrode is on the gate dielectric. A first source or drain structure is at a first side of the gate electrode. A first dielectric spacer is between the first source or drain structure and the first side of the gate electrode. A second source or drain structure is at a second side of the gate electrode opposite the first side. A second dielectric spacer is between the second source or drain structure and the second side of the gate electrode. A ferroelectric or antiferroelectric polycrystalline material layer is beneath the first and second dielectric spacers and adjacent the gate dielectric.

Example embodiment 20: The integrated circuit structure of example embodiment 19, wherein the ferroelectric or antiferroelectric polycrystalline material layer is an oxide including Zr and Hf, and wherein the gate dielectric includes a layer of amorphous hafnium oxide.

Example embodiment 21: The integrated circuit structure of example embodiment 19 or 20, wherein the ferroelectric or antiferroelectric polycrystalline material layer has at least 80% orthorhombic crystallinity.

Example embodiment 22: The integrated circuit structure of example embodiment 19 or 20, wherein the ferroelectric or antiferroelectric polycrystalline material layer has at least 80% tetragonal crystallinity.

What is claimed is:

1. An integrated circuit structure, comprising:
a semiconductor channel structure comprising a monocrystalline material;
a gate dielectric over the semiconductor channel structure, the gate dielectric comprising a ferroelectric or antiferroelectric polycrystalline material layer, the ferroelectric or antiferroelectric polycrystalline material layer having an uppermost surface, and the gate dielectric further comprising an amorphous oxide layer between the ferroelectric or antiferroelectric polycrystalline material layer and the semiconductor channel structure, wherein the ferroelectric or antiferroelectric polycrystalline material layer is on and in direct contact with the amorphous oxide layer, and wherein the amorphous oxide layer is on and in direct contact with the semiconductor channel structure;
a gate electrode having a conductive layer on and in direct contact with the ferroelectric or antiferroelectric polycrystalline material layer, the conductive layer comprising a metal, and the conductive layer having an uppermost surface co-planar with the uppermost surface of the ferroelectric or antiferroelectric polycrystalline material layer, and the gate electrode having a gate fill layer on and in direct contact with the conductive layer;
a first source or drain structure at a first side of the gate electrode; and
a second source or drain structure at a second side of the gate electrode opposite the first side.

2. The integrated circuit structure of claim 1, wherein the ferroelectric or antiferroelectric polycrystalline material layer is a ferroelectric polycrystalline material layer.

3. The integrated circuit structure of claim 2, wherein the ferroelectric polycrystalline material layer is an oxide comprising Zr and Hf with a Zr:Hf ratio of 50:50 or greater in Zr.

4. The integrated circuit structure of claim 2, wherein the ferroelectric polycrystalline material layer has at least 80% orthorhombic crystallinity.

5. The integrated circuit structure of claim 1, wherein the ferroelectric or antiferroelectric polycrystalline material layer is an antiferroelectric polycrystalline material layer.

6. The integrated circuit structure of claim 5, wherein the antiferroelectric polycrystalline material layer is an oxide comprising Zr and Hf with a Zr:Hf ratio of 80:20 or greater in Zr.

7. The integrated circuit structure of claim 5, wherein the antiferroelectric polycrystalline material layer has at least 80% tetragonal crystallinity.

8. An integrated circuit structure, comprising:
a semiconductor channel structure comprising a monocrystalline material;
a gate dielectric over the semiconductor channel structure, the gate dielectric comprising a ferroelectric or antiferroelectric polycrystalline material layer, the ferroelectric or antiferroelectric polycrystalline material layer having an uppermost surface, and the gate dielectric further comprising an amorphous oxide layer between the ferroelectric or antiferroelectric polycrystalline material layer and the semiconductor channel structure, wherein the ferroelectric or antiferroelectric polycrystalline material layer is on and in direct contact with the amorphous oxide layer, and wherein the amorphous oxide layer is on and in direct contact with the semiconductor channel structure;
a gate electrode having a conductive layer on and in direct contact with the ferroelectric or antiferroelectric polycrystalline material layer, the conductive layer comprising a metal, and the conductive layer having an uppermost surface co-planar with the uppermost surface of the ferroelectric or antiferroelectric polycrystalline material layer, and the gate electrode having a gate fill layer on and in direct contact with the conductive layer;
a first source or drain structure at a first side of the gate electrode;
a first dielectric spacer between the first source or drain structure and the first side of the gate electrode;
a second source or drain structure at a second side of the gate electrode opposite the first side; and
a second dielectric spacer between the second source or drain structure and the second side of the gate electrode.

9. The integrated circuit structure of claim 8, wherein the ferroelectric or antiferroelectric polycrystalline material layer extends along the first dielectric spacer and the second dielectric spacer.

10. The integrated circuit structure of claim 8, wherein the ferroelectric or antiferroelectric polycrystalline material layer is a ferroelectric polycrystalline material layer.

11. The integrated circuit structure of claim 10, wherein the ferroelectric polycrystalline material layer is an oxide comprising Zr and Hf with a Zr:Hf ratio of 50:50 or greater in Zr.

12. The integrated circuit structure of claim 10, wherein the ferroelectric polycrystalline material layer has at least 80% orthorhombic crystallinity.

13. The integrated circuit structure of claim 8, wherein the ferroelectric or antiferroelectric polycrystalline material layer is an antiferroelectric polycrystalline material layer.

14. The integrated circuit structure of claim 13, wherein the antiferroelectric polycrystalline material layer is an oxide comprising Zr and Hf with a Zr:Hf ratio of 80:20 or greater in Zr.

15. The integrated circuit structure of claim 13, wherein the antiferroelectric polycrystalline material layer has at least 80% tetragonal crystallinity.

16. An integrated circuit structure, comprising:
- a semiconductor channel structure comprising a monocrystalline material;
- a gate dielectric over the semiconductor channel structure, the gate dielectric comprising an amorphous oxide layer;
- a gate electrode above the gate dielectric, the gate electrode having a conductive layer having an uppermost surface, and the gate electrode having a gate fill layer on and in direct contact with the conductive layer;
- a first source or drain structure at a first side of the gate electrode;
- a first dielectric spacer between the first source or drain structure and the first side of the gate electrode;
- a second source or drain structure at a second side of the gate electrode opposite the first side;
- a second dielectric spacer between the second source or drain structure and the second side of the gate electrode; and
- a ferroelectric or antiferroelectric polycrystalline material layer adjacent the first and second dielectric spacers and adjacent the gate dielectric, the ferroelectric or antiferroelectric polycrystalline material layer having an uppermost surface co-planar with the uppermost surface of the gate electrode, wherein the ferroelectric or antiferroelectric polycrystalline material layer is on and in direct contact with the amorphous oxide layer of the gate dielectric, wherein the conductive layer of the gate electrode is on and in direct contact with the ferroelectric or antiferroelectric polycrystalline material layer, and wherein the amorphous oxide layer is on and in direct contact with the semiconductor channel structure.

17. The integrated circuit structure of claim 16, wherein the ferroelectric or antiferroelectric polycrystalline material layer is an oxide comprising Zr and Hf, and wherein the gate dielectric comprises a layer of amorphous hafnium oxide.

18. The integrated circuit structure of claim 17, wherein the ferroelectric or antiferroelectric polycrystalline material layer has at least 80% orthorhombic crystallinity.

19. The integrated circuit structure of claim 17, wherein the ferroelectric or antiferroelectric polycrystalline material layer has at least 80% tetragonal crystallinity.

* * * * *